US 7,561,995 B2

(12) United States Patent
Willis et al.

(10) Patent No.: US 7,561,995 B2
(45) Date of Patent: Jul. 14, 2009

(54) METHOD FOR USING COUPLED FEA ANALYSES OF DIFFERENT LEVELS OF ORGANIZATION WITHIN AN ENTITY TO ANALYZE THE ENTITY

(76) Inventors: Mark Benjamin Willis, 2960 Hunters Ct., Canton, MI (US) 48188; Mark Lawson Palmer, 1430 S. Maple Rd., Ann Arbor, MI (US) 48103-4438

( * ) Notice: Subject to any disclaimer, the term of this patent is extended or adjusted under 35 U.S.C. 154(b) by 0 days.

(21) Appl. No.: 11/432,821

(22) Filed: May 11, 2006
(Under 37 CFR 1.47)

(65) Prior Publication Data
US 2006/0282240 A1  Dec. 14, 2006

Related U.S. Application Data

(60) Provisional application No. 60/680,090, filed on May 12, 2005.

(51) Int. Cl.
*G06G 7/48* (2006.01)
*G06F 7/60* (2006.01)
(52) U.S. Cl. ............................................. 703/6; 703/2
(58) Field of Classification Search ................... 703/2, 703/6
See application file for complete search history.

(56) References Cited

U.S. PATENT DOCUMENTS 7,215,334 B2 *  5/2007  Nishigaki et al. ........... 345/418
2004/0249809 A1 * 12/2004  Ramani et al. ................. 707/4
2007/0014459 A1   1/2007  Palmer

OTHER PUBLICATIONS

Robert L. Taylor, FEAP_Finite Element Analysis Program, Version 7.3, Dec. 2000.*
J.P. Bardet, Finite Element Analysis of Rockburst as surface instability, 1990.*

* cited by examiner

*Primary Examiner*—Paul L Rodriguez
*Assistant Examiner*—Andre Pierre Louis

(57) ABSTRACT

A method and computer-implemented system for coupling multiple, concurrently-running FEA analyses of an entity that has multiple levels of organization in a way that enables each analysis to inform and be informed by analyses of higher and/or lower levels of organization in the entity. The method and preferred system includes describing an entity at multiple levels of organization (for example, multiple length scales) with FEA models and defining the interplay between the various models. Further, the method and preferred system includes initializing, managing and controlling the interaction between the multiple, concurrently-running FEA analyses. The resulting overall, improved analysis provides more accurate modeling information about each individual level of organization than traditional "single-level FEA" analysis of that level by accounting for the behavior of and interaction between multiple levels of organization in the entity.

21 Claims, 8 Drawing Sheets

Overview of the current invention applied to the table in Figure 1

Figure 1: Illustration of multiple levels of organization in a Table
High Level (Level #1)     Low Level (Level #2)
(Table definition)     (Composite definition)
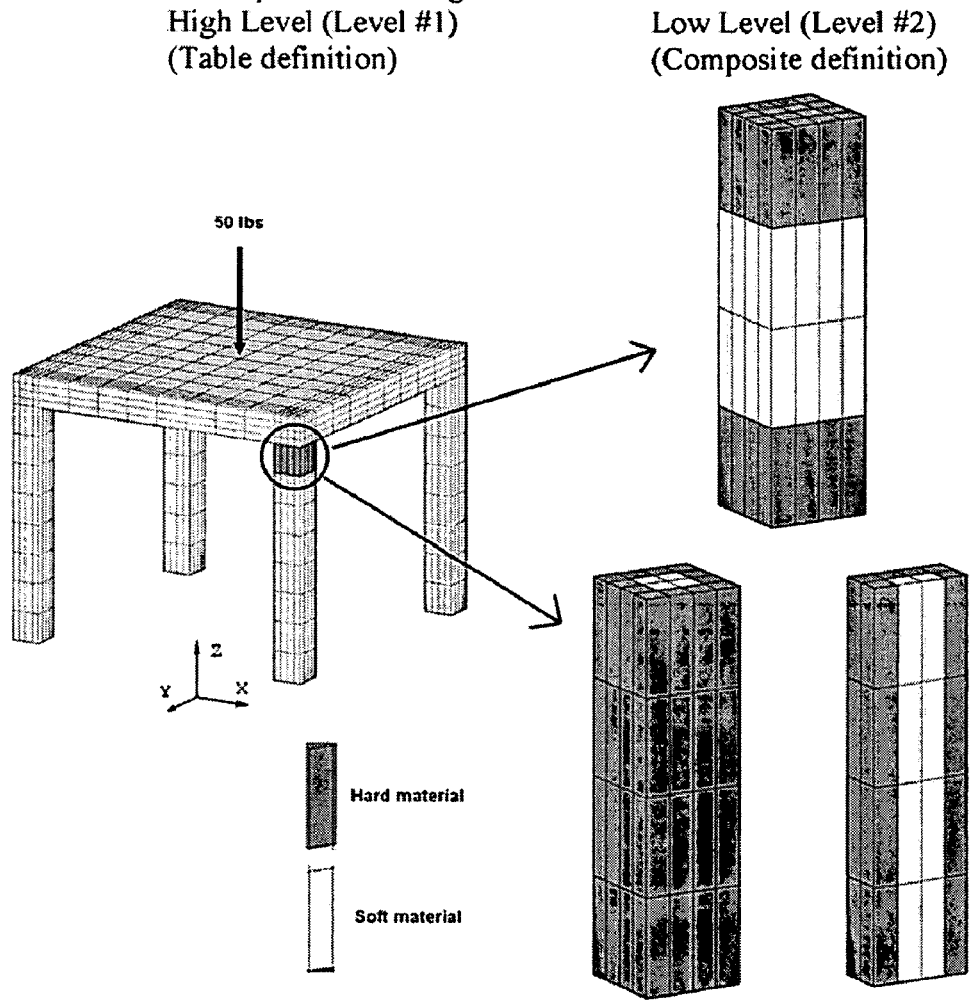
Figure 2: Illustration of multiple levels of organization in Biological Tissue
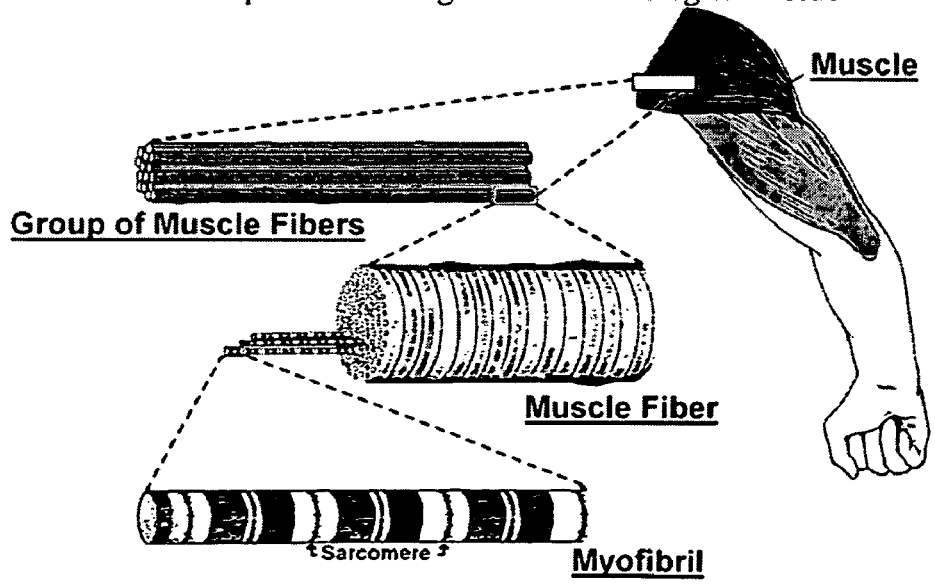

Figure 3: Overview of the current invention applied to the table in Figure 1
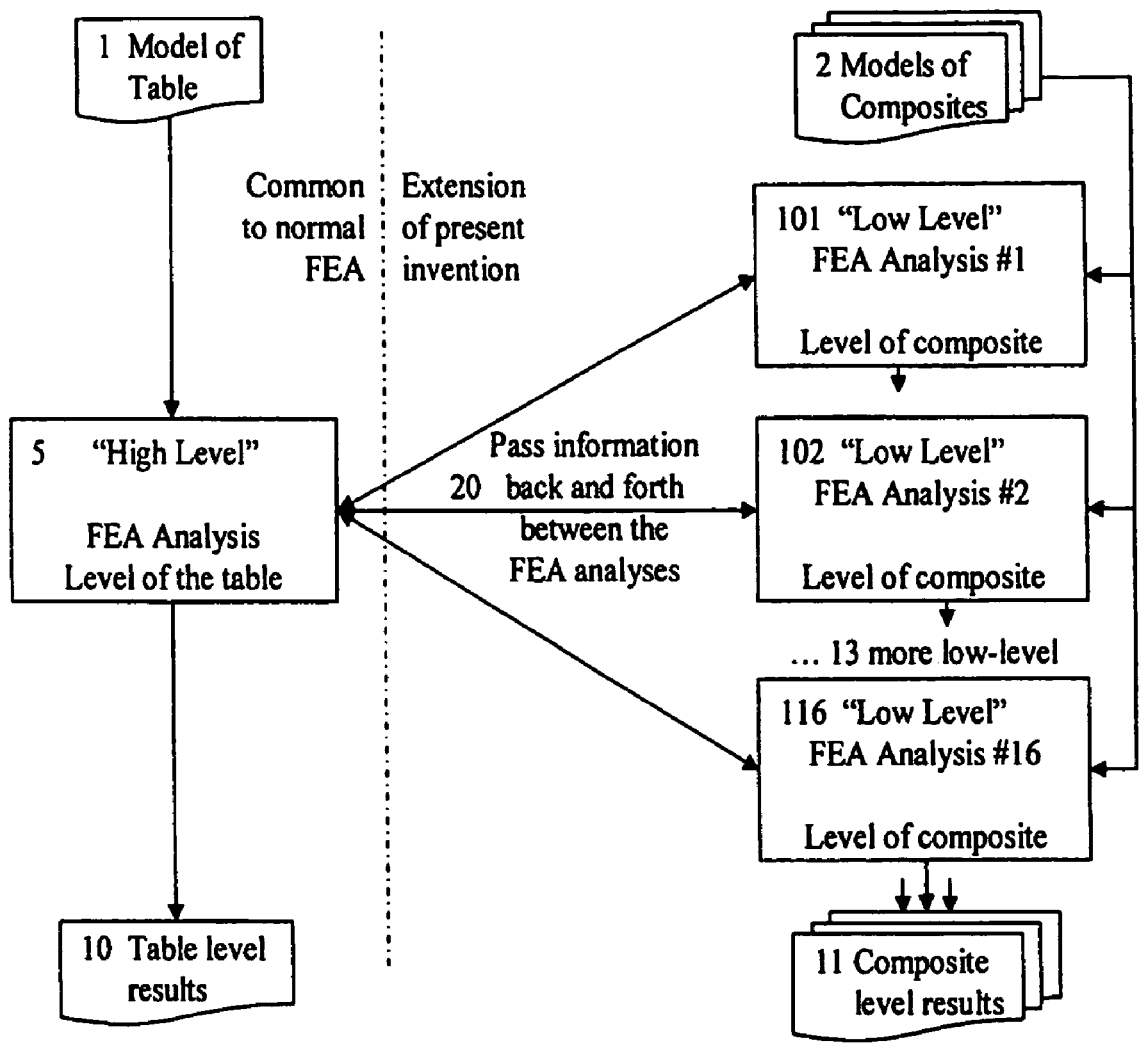

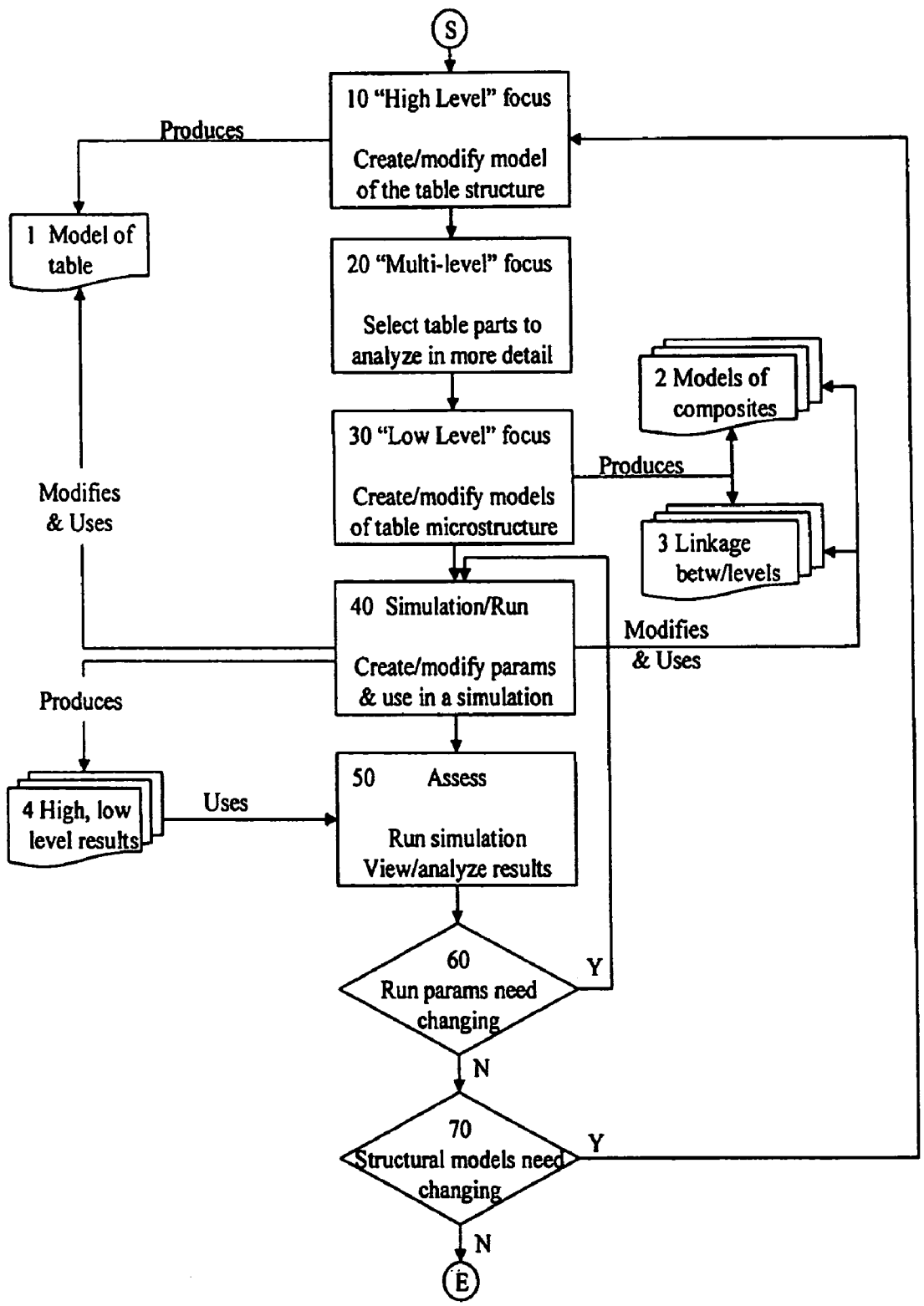
Figure 4: Analysis overview using current invention applied to the table in Fig 1

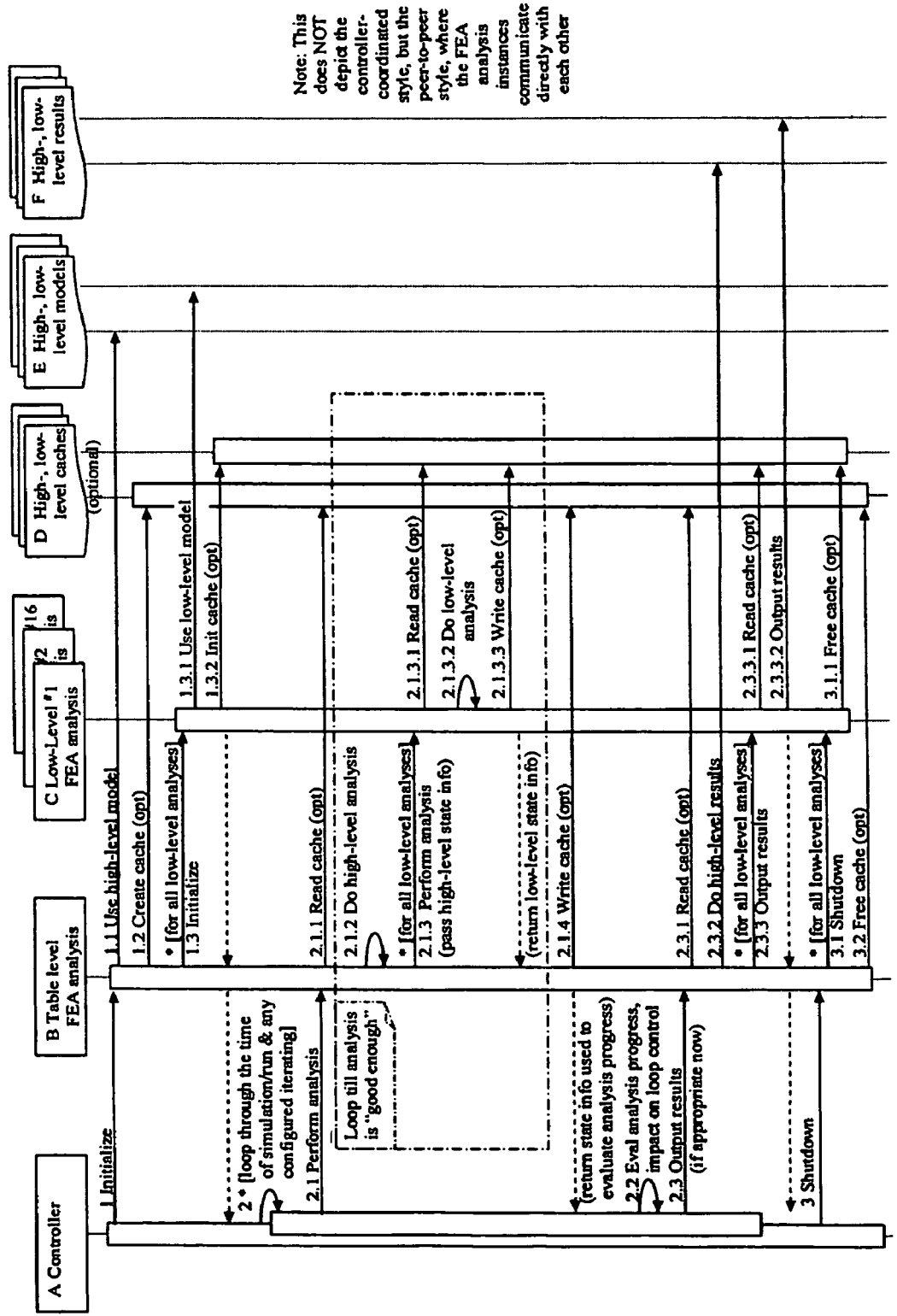
Figure 5: Sequence diagram of a simulation/run using current invention applied to the table in Figure 1

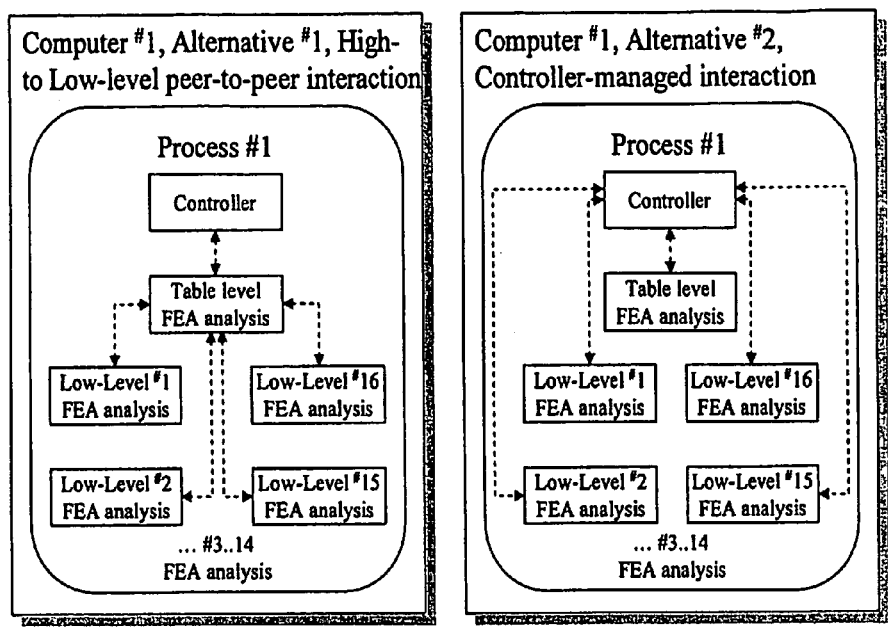
Fig. 6a: Simple deployment configuration for a simulation/run for the Table in Figure 1

Figure 6b: <u>Single process, core memory & disk cache</u> configuration for a simulation/run of table in Figure 1:
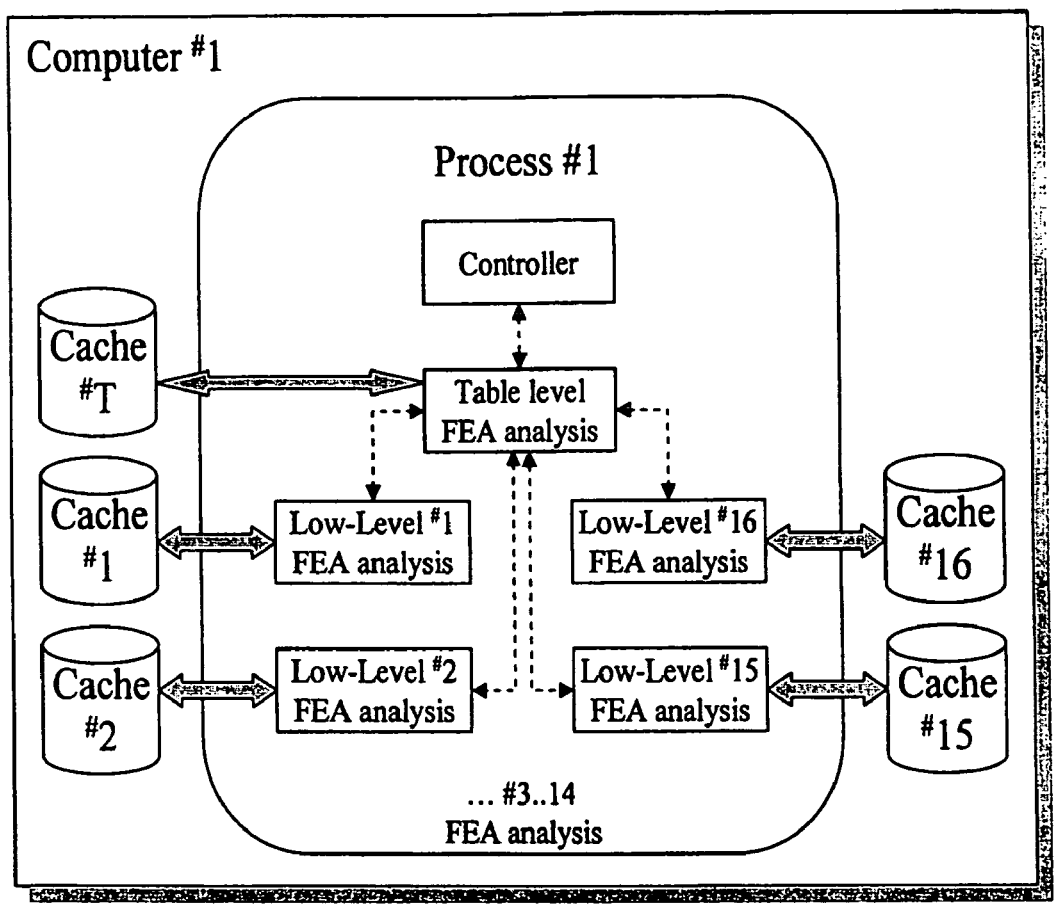

Figure 6c: Multiple processes, core memory configuration for a simulation/run of table in Figure 1.
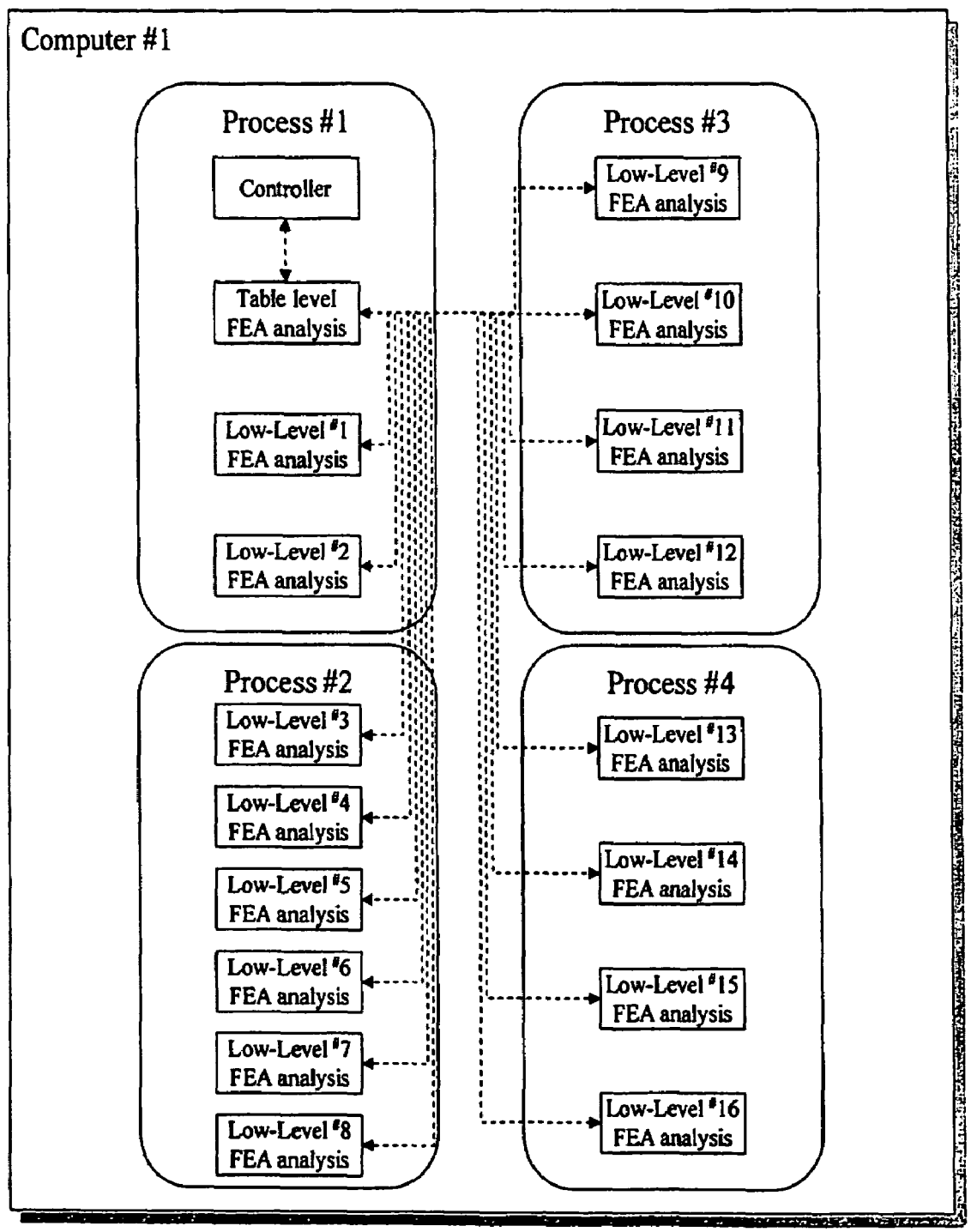

Figure 6d: Multiple machines, core memory & disk cache configuration for a simulation/run of a table in Figure 1.
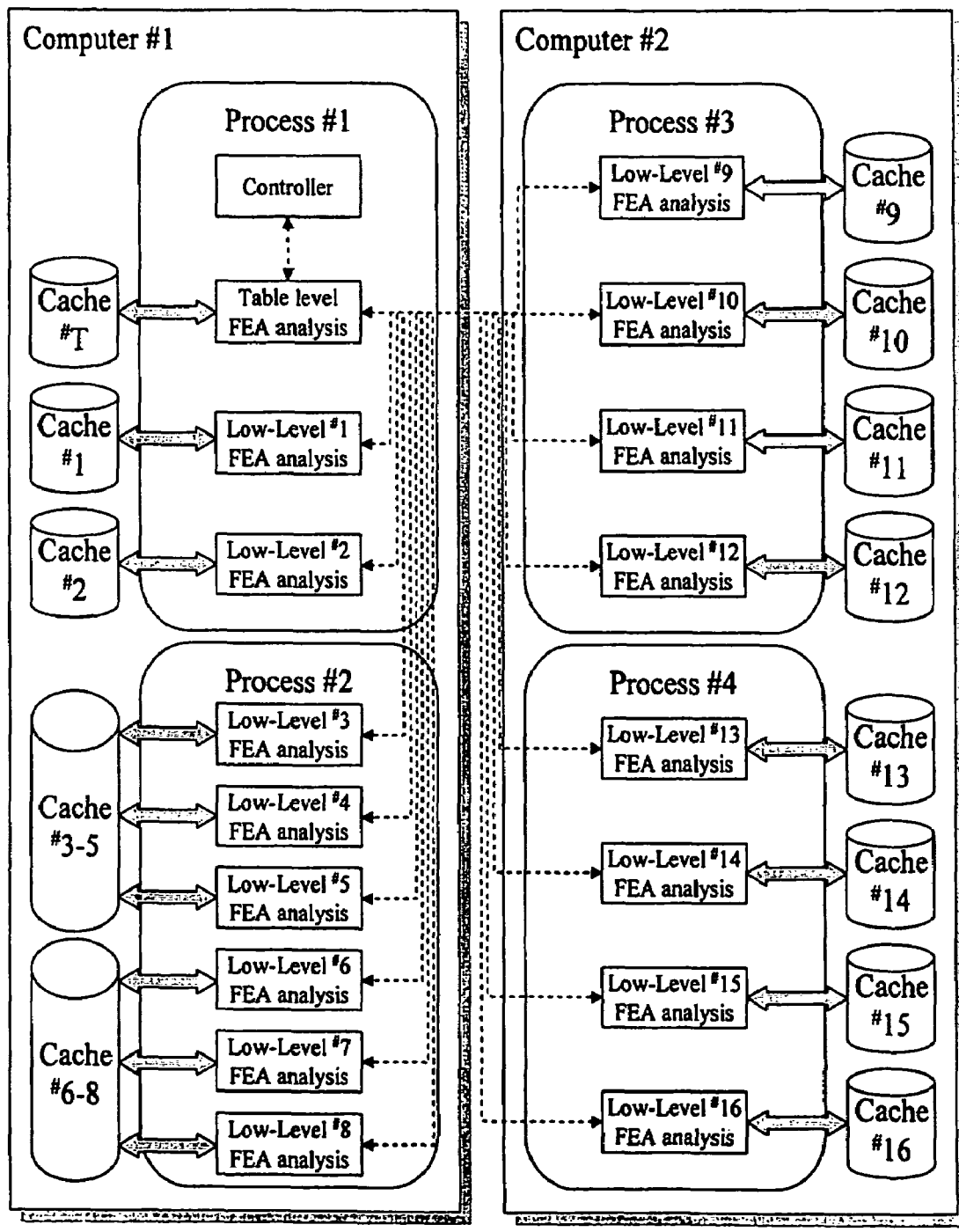

US 7,561,995 B2

METHOD FOR USING COUPLED FEA ANALYSES OF DIFFERENT LEVELS OF ORGANIZATION WITHIN AN ENTITY TO ANALYZE THE ENTITY

CROSS REFERENCE TO RELATED APPLICATIONS

This application claims the benefit of U.S. Provisional Application No. 60/680,090, filed on May 12, 2005.

TECHNICAL FIELD

This disclosure relates generally to Finite Element Analysis (FEA) methods, and relates more particularly to coupled FEA methods for analyzing entities with different levels of organization.

BACKGROUND

Every form of matter, regardless of size or scale, ranging from atoms and molecules to columns and skyscrapers, is subjected to physical interaction with the environment. These interactions may take the form of electrical, chemical, magnetic, thermal or force fields. In many fields of endeavor, the study of the physical properties of an entity and its interaction to these environmental forces has been motivated by a desire to understand the response of an entity to its environment or the desire to interact with it or to create a new and improved version of it.

With the advent of computer technology, those engaged in this type of study were able to leverage an incredibly powerful tool to enhance their ability to understand physical entities and systems. Computational modeling, using the computer to model entities "virtually", gave rise to many strategies for description and analysis. One such strategy, which began in earnest in the 1950s, came to be widely recognized as having enormous potential for computational modeling, and became known as the Finite Element Method (FEM). In Finite Element Analysis (FEA), a computer model of an entity is used to evaluate its reaction to various forces. The utility of FEA is readily seen in the fact that it is commonly used in nearly every engineering field, and is perhaps the most widely used computational modeling technique used in engineering design and analysis.

When using FEA, a "model" of the entity is created using a computer, and then "virtual" environmental forces are described and applied to the model. Viewing the results provides insight into how a real-world entity would actually behave in a situation similar to the one in the FEA model. Since the 1970s, the ability of the FEM to usefully describe physical phenomena has been widely recognized.

However, one of the limitations of the Finite Element Method is that the properties of the entity must be well understood in order to be modeled accurately. An FEA model can be visualized by thinking of a "Lego® model", where the "Lego®" pieces are of various sizes and shapes (sometimes very complex shapes). Performing an analysis requires that each "Lego®" piece has a well-defined set of behavior, with respect to the forces the model will use (for example, pressure or heat or electrical forces).

The challenge with FEA modeling is to correctly include in the model the aspects necessary to describe the behavior of interest. Essentially, this correct modeling means sufficiently describing the behavior of each "Lego®" piece in the model, at the level required to evaluate the impact of the "virtual environmental forces" in the problem. This correct modeling has been less of a problem for traditional materials like steel, but has become more of a problem as man-made materials have increased in complexity, especially man-made composites. Additionally, composite materials are common in nature. Examples include wood, bone, the exoskeleton of insects, and many biological tissues. These biological materials are extremely complex, both in behavior and complexity of structure, and have therefore presented difficulties for traditional FEA.

The fundamental difficulty with modeling such materials using FEA stems from the fact that they are entities which have "multiple levels of organization." For example, consider the hull of a fiberglass boat. In order to model the boat, "Lego®" pieces of the boat hull would need to be in the model. However, fiberglass is a mixture of microscopic glass fibers bonded together with glue, and the orientation and length and strength of the fibers has a dramatic impact on the behavior of a piece of fiberglass. Similarly, bending a piece of fiberglass impacts all the microscopic fibers at the bend, potentially damaging some, and thus impacting the behavior of the piece of fiberglass.

A similar problem exists in many biological tissues because of the inherently hierarchical nature of cells which are organized in various levels to form various types of tissue. Consider skeletal muscle, for example, which is illustrated in FIG. 2. Bulk muscle is composed of a hierarchical structure in which proteins are organized into force-generating units called "Sarcomeres", which are organized into Myofibrils, which are organized into Muscle Fibers, which are organized into Groups of Muscle Fibers, which compose bulk muscle.

The problem with using the Finite Element Method on a problem like muscle is that accurately modeling the behavior of muscle requires inclusion of the behavior of each of the levels within this hierarchy, as well as the interactions between layers.

Therefore, a need exists for a method to create a coupled system of 2 or more FEA analyses which run concurrently and work together to model an entity with multiple levels of organization.

BRIEF DESCRIPTION OF THE DRAWINGS

The present invention will become more fully understood from the detailed description and the accompanying drawings, wherein:

FIG. 1 illustrates an example of an entity which has 2 levels of organization, showing a table made out of a composite material that is a mixture of 2 other materials.

FIG. 2 illustrates an second example of an entity which has several levels of organization, showing a hierarchal, multi-level organizational structure of skeletal muscle, from the level of organization of the bulk muscle down to the level of organization of the proteins which make up a sarcomere.

FIG. 3 illustrates FEA analysis instances involved in a simulation/run of the 2-level Table problem pictured in FIG. 1.

FIG. 4 illustrates a process for applying the present disclosure to the Table problem pictured in FIG. 1.

FIG. 5 illustrates a sequence diagram illustrating the process of executing a "simulation/run" applied to the Table problem pictured in FIG. 1.

FIGS. 6a-d are diagrams illustrating the memory layout for a simulation/run of the Table problem pictured in FIG. 1 which is illustrated in FIG. 5.

FIG. 6a illustrates a "run" executing in a single process using core memory.

FIG. 6b illustrates a "run" executing in a single process using both core memory and disk cache.

FIG. 6c illustrates a "run" executing in multiple processes on the same computer using core memory.

FIG. 6d illustrates a "run" executing in multiple processes on multiple computers using both core memory and disk cache.

DETAILED DESCRIPTION OF EXAMPLES OF EMBODIMENTS

The present disclosure generally relates to the use of FEA methods for modeling the behavior of an entity which contains multiple levels of organization, in which the overall behavior of the entity depends on the interaction between the different levels of organization. The present disclosure further relates to a method for using 2 or more concurrently running instances of FEA models each operating at one of the 2 or more levels of organization within the entity being modeled. Further, the disclosure relates to the method of connecting these models of different levels, such that the analysis performed at a given level is informed by and also informs the analysis at higher and/or lower levels, with the result being an ability to model the behavior of such entities in a novel and more accurate way. As an example, each FEA model/analysis can be focused on a single level of the entity and can interact with models/analyses at higher and/or lower levels so that each one informs the related analyses about its analysis. The result enables analysis of entities with multiple levels of organization that would otherwise be too complex to analyze accurately using single level FEA.

Modeling of this nature using FEA methods is applicable to entities which have multiple levels of organization where the behavior of the entity at one level is interdependent on or interrelated to the state of the entity at higher and/or lower levels of organization, and where describing the behavior at one of the levels with the required accuracy or precision either requires or is enhanced by having the modeling take into account the state of the higher and/or lower levels of organization in the entity and/or the interaction between the levels. Such entities present themselves in the physical world, for example, in the form of biological tissue and complex man-made materials among other places, and also in the "theoretical" or "mathematical" world in the form of various mathematical algorithms such as those used for encryption.

In accordance with one embodiment, a method for analyzing an entity with multiple levels of organization includes coupling multiple FEA analyses, each performing analysis on a level of organization, such that the analyses are linked in real-time, with each FEA analysis informing and being informed by related analyses at higher and/or lower levels of organization. The method further includes managing the initiation, coordination and termination of the various concurrently-running FEA analyses.

Further areas of applicability will become apparent from the detailed description provided hereinafter. It should be understood that the detailed description and specific examples, while indicating a preferred embodiment of the invention, are intended for purposes of illustration only and are not intended to limit the scope of the claims.

In one example, a system comprises multiple running instances of FEA-based analysis, each of which is focused on modeling the entity of interest at a specific level of organization in the entity. The system further includes a "controller" that coordinates the overall setup of the FEA analysis instances, stepping through the execution of the simulation, and decisions about when to generate results. It is responsible for insuring the FEA analysis instances are correctly initialized and communicate correctly (either directly or through the controller) based on the definition of various models intended to represent the multiple levels of organization in the entity and the way they are linked together to describe the entity. The system further insures that the multiple FEA analysis instances communicate and interact with each other in the appropriate ways based on the problem setup and drives the process of a solution "simulation" or "run", so that the behavior in each running FEA model is informed by and informs that of models operating at higher and/or lower levels that are connected to it.

The following description of the preferred embodiment(s) is merely exemplary in nature and is in no way intended to limit the disclosure, its application, or uses.

FIG. 1 provides a simple illustration of an entity with multiple levels of organization, which can be used to illustrate a preferred embodiment. On the left side of the figure, the "High Level" description of the table is presented. This description includes the overall make-up of the table itself, things like how long the legs are, how wide the table top is, and how thick each part of the table is. It is also the level at which many relevant questions must be posed, for example, "How will this table react if I put 50 lbs on the table top—will it support the weight, and if so, will the legs or table top bow?"

Answering a question of this nature has been a straightforward thing to do using FEA for several decades if the table is composed of a material that is "simple enough" to model. The left side of FIG. 1 illustrates such a model, composed of "virtual Lego®" pieces.

However, if the table is composed of a composite microstructure made up of a soft and a hard material, for example, questions about how the table will react become much harder to answer using traditional FEA. FIG. 1 illustrates two examples of what the composite might look like—the top example is a banded structure of hard and soft material and the bottom example is a honeycomb structure of hard material surrounding soft material. In the present figure, the hard material is darker than the soft material. Consider the accuracy of the analysis of the High-Level model if it is not informed by the concurrent activity at the level of the composite mixture, the Low-Level model. As the table bends under the weight of the force on the table top, which will be predicted by the FEA analysis of the High-Level model, the microstructure itself will absorb the forces by undergoing some sort of deformation. This deformation will impact the hard and soft material unequally. Consequently, the physical structure of the composite will change, which also will change the material properties like strength at places in the leg and tabletop where there is bending.

FIG. 2 illustrates an even more complex biological example which contains several levels of organization. Muscle bulk is composed of Groups of Muscle Fibers, which are composed of individual Muscle Fibers, each of which is composed of Myofibrils, each of which is a stacked sequence of Sarcomeres, the force generating unit, which are composed of several proteins in specific geometric configurations. As with the much simpler table example, accurately performing an FEA analysis at anyone of these levels of organization in muscle requires understanding the dynamics of the levels above and/or below it.

As previously described above, the focus of prior FEA art regarding complex man-made and biological composites like these has primarily been on improving the mathematical description of materials at a given length scale. Additionally, a number of researchers in "Homogenization Theory" have attempted to develop theoretical models and algorithms that specifically account for of interaction between the behavior at various length scales or levels of organization. This work has provided mathematical algorithms for trying to summarize the behavior of lower/smaller levels for the purposes of modeling higher/larger levels. Mathematical modeling by the co-inventor of the current invention has extended these algorithms to apply the other direction as well, from larger to smaller length scales.

FIG. 3 illustrates an example of an embodiment based on the example 2-level problem of the composite table from FIG. 1. Aspects of normal FEA analysis appear to the left of the dashed line. They include defining the model of the table (1) which is used to drive the FEA analysis at the level of the table (5) to generate results (10) which describe the expected impact on the table of the hypothetical forces included in the model.

The present embodiment couples this traditional FEA analysis with additional analyses, as illustrated by the contents of FIG. 3 to the right of the dashed line. Models of the composite microstructure (2) are created in an analogous way to those describing the table itself. These models, for example, describe the Low-level description of the composite material shown in FIG. 1, the various mixtures of hard and soft materials. These models are used as the basis for an additional 1-to-many FEA analyses (101, 102 and 116) that focus on the level of the microstructure. FIG. 1 illustrates a scenario where a section at the top of one of the table legs is of particular interest (circled) and will be modeled at the detailed level of the constituent microstructure. FIG. 3 illustrates the existence of these FEA analysis instances, each of which would be focused on analyzing the composite microstructure at a specific location (i.e., a "Lego®" pieces) in the High Level table model as that Lego® piece deforms during the simulation. In the case illustrated in FIG. 1, 16 Lego® pieces or elements of the Table are to be modeled at the level of their constituent microstructure. Thus, the "Low-level" FEA analysis in FIG. 3, boxes (101), (102) and (116) would represent 16 distinct analyses, each focused on one of the 16 Lego® pieces/elements in the table leg. Naturally, each of these analysis instances works off of the appropriate microstructure model definition (2) and generates results for the level of the microstructure (11).

An aspect of the present embodiment is the coupling of these 17 distinct FEA analysis instances. First, each of the analysis instances is tied to a common "clock" for the simulation which controls the sequence through the specified hypothetical scenario that is being modeled in a given simulation. This keeps all the analysis instances in lock step, so that at any given point they are all working on their specific aspects of the problem at the same point in the overall modeling/simulation problem. This coordinated coupling enables a second type of interaction between the FEA analysis instances, namely, the coordinated communication of state information between the FEA analysis instances (20).

The coordination of communication between FEA instances is controlled by the definition/setup of the problem in the relationship between the various models, e.g., the Table level model (1) and Composite Microstructure models (2). As illustrated by FIG. 1, in this example the 16 Lego® pieces/elements in the Table model are each described by one of the 2 microstructures, the banded mixture or the honeycomb mixture of the hard and soft materials. Thus, as illustrated in FIG. 3, the High-Level analysis of the Table (5) is coupled with each of the 16 Low-Level analyses that are focused on a specific section of the Table.

FIG. 4 illustrates the process for using an example of an embodiment on the Table problem pictured in FIG. 1 in the context of the overall process that would be used to analyze the Table of FIG. 1. First, a focus on creating the high-level description of the Table (10) would generate an FEA model of the table suitable for FEA analysis (1). Subsequently, a focus on the multi-level aspects of the table (20) would lead to (30) the creation of "low-level" models describing the microstructure of the table in areas where the level of the microstructure is of interest. This analysis would generate both FEA models of the composite microstructure (2) and the linkage between the various models (3) which would be required to run the 17 FEA analysis instances during the actual simulation. Setting up the simulation (40) involves specifying the various parameters, including the properties of the various FEA models and their relationship to each other. For example, each Lego® piece/element in the Table Model that contains a microstructure must be linked to the correct microstructure model. Subsequent to the simulation/run (40) which uses all the models (1, 2) and definition of linkage between levels (3) and generates the high-level (Table) and low-level (composite microstructure) results (4), an assessment process would evaluate the information gathered. This assessment (60) may result in the need to modify the simulation/run parameters for a subsequent simulation (60-Y) or indicate the need to review and modify the Table and/or Microstructure definitions themselves (70-V).

In the present embodiment, the process of creating the FEA models for the high and low-levels (10 and 30) proceeds as model generation would for any FEA analysis with 2 exceptions. First, normal FEA analysis only uses a single level. Second, the present embodiment requires the specification of the linkage or connectivity information that connects the information in the various models ((3) in FIG. 4). Continuing the example of the Table pictured in FIG. 1, this linkage information involves specifying each of the Lego® pieces/elements in the Table (high-level model) that will be connected to a low-level FEA analysis instance focused on the microstructure of the Lego® piece/element at that point. In one embodiment, the following are described in the linkage for each of these Lego® pieces/elements in the Table:

1. Which microstructure model defines the "Low-Level" description of the linkable Lego® piece/element.

2. How often to pass state information back and forth between the High-Level table analysis and the Low-Level composite analysis.

3. What state information to pass from the High-Level analysis to the Low-Level analysis, and what information to pass from the Low-Level analysis to the High-Level analysis. Examples include, but are not limited to, instantaneous and/or life of problem element values for stiffness, stress, strain, velocity, length, volume, displacement, and other element values.

FIG. 5 is a sequence diagram illustrating one embodiment in action working on the Table problem pictured in FIG. 1 which shows the interaction between the controller (A), the FEA analysis instances (B, C), the optional caches D), the models (E) and the results (F). Notice that for the sake of simplicity FIG. 5 illustrates the configuration of the preferred embodiment in which the controller function (A) is used exclusively for control of the overall problem initialization (1) control (2) and shutdown (3) but not for managing the interaction between the FEA instances as they pass state back and forth (2.1.2 and 2.1.3). In the preferred embodiment, the controller (A) can also function as an intermediary between the various FEA analysis instances (B, C). Under this configuration, the sequence diagram of FIG. 5 would obviously be more complicated than in the peer-to-peer case that is illustrated with the FEA instances communicating with each other directly.

The simulation/run begins with the controller (A) initializing the FEA analysis instances. In the preferred embodiment configuration illustrated in FIG. 5, the controller (A) directly initializes the High-level FEA instance (1, B), which uses the high-level model (1.1, 0), and the controller (A) also delegates the task of initializing the 16 low-level instances (1.3) to the High level FEA Analysis (B). As with the High-Level FEA analysis instance (B), each of the 16 low-level FEA analysis instances (C) uses the appropriate low-level model to initialize (1.3.1, E). Notice, also, that if the configuration is set up to use caching rather than executing all analysis entirely in memory, the high-level (B) and low-level (C) FEA analysis instances also initialize their respective caches during initialization (1.2, 1.3.2, D).

Following problem initialization (1), the primary function of the controller under the configuration of the preferred embodiment illustrated in FIG. 5 can control movement through the simulation/run timeline, and coordinate the convergence criteria that determines when to continue analysis at a point in the simulation/run and when to step on in the timeline. This function (2) involves looping through the time of the simulation/run as well as through any iteration within a time step. Various styles of FEA analysis dictate various strategies for iterating through the solution space in search of a "good enough" answer to continue to the next step in the simulation/run timeline. The controller performs this analysis (2.2) based on the results of the various FEA analysis instances (return information from 2.1).

Within the loop through the timeline and iteration of the overall problem (2) the controller (A) performs 3 basic functions; namely, communicating to the FEA analysis instances to "do the next analysis step" (2.1), evaluation of the current state of the FEA analysis instances to determine progress through the simulation/run (2.2), and specification of what results (F), if any, to have the FEA analysis instances output (2.3).

Subsequent to the analysis function, the controller (A) is responsible for insuring the FEA instances shut down correctly (3). Again, in the configuration illustrated in FIG. 5, the Table-level FEA instance (B) passes the shutdown command to the 16 low-level FEA analysis instances (3.1, C). If caching was used, all 17 FEA analysis instances (B, C) also free the cache during shutdown (3.2, 3.1.1).

Drilling into the analysis function (2.1), the following is evident for the configuration of the preferred embodiment illustrated in FIG. 5 where the Table-level analysis instance (B) communicates directly with the 16 low-level FEA analysis instances (C). Each analysis step involves a process of analysis at the Table level (B, 2.1.2) and communication with the 16 low-level FEA analysis instances (C) with state information passed to and from these instances (2.1.3). At the Table-level (B), the analysis (2.1.2) and communication with low-level analysis instances (2.1.3) is optionally wrapped by reading and updating of the cache (2.1.1, 2.1.4). Similarly, the analysis at each of the low-level FEA instances (C, 2.1.3.2) is optionally wrapped by reading from and writing to its cache (2.1.3.1, 2.1.3.3). Notice that this High-level (B) process of analysis (2.1.2) and communication with low-level analysis (C, 2.1.3) can loop until the interaction between all the analysis instances (B, C) "settles" to a "stable" state. As the Table-level (B) and low-level (C) analysis instances communicate back and forth, they may need to iterate through 1 or more times of analysis (2.1.2, 2.1.3.2) and (2.1.3) communication because of the interaction between the analysis instances at the 2 levels (B, C) and the impact that state information at each level may have on analysis at the other level.

At each step in the overall looping through the simulation/run (2), the controller (A), uses the state information returned from the FEA analysis at that step (2.1 return) to evaluate overall progress of the simulation/run. This evaluation (2.2) can optionally include communication directly with the FEA analysis instances at the High-level (B) or Low-level (C) as well, although FIG. 5 communicates the simpler configuration in which all required state information is returned from the analysis itself (2.1).

Results from the overall evaluation of the progress through the simulation/run (2.2) can then be used to guide the determination of when results (F) should be output (2.3). This process again involves the Table-level (B) and low-level (C) analysis instances outputting results (F, 2.3.2 and 2.3.2, 2.3.3.2) with interaction with their respective caches if caching is configured (2.3.1, 2.3.3.1).

Subsequent to the completion of the simulation (2), the controller (A) insures the FEA analysis instances (B, C) and caches (if used, D) are cleaned up, during shutdown (3).

FIG. 5, therefore, illustrates the overall process of performing a 2-level analysis of the Table illustrated in FIG. 1, using 16 low-level FEA analysis instances (C) communicating with the Table-level FEA analysis (B). For simplicity, FIG. 5 illustrates the configuration in which the controller (A) allows direct interaction between the related analysis instances (B, C).

For a variety of reasons, such simplicity might not be the preferred embodiment in a more complex or time-consuming example. Therefore, another embodiment further requires specification of the appropriate simulation/run environment to use for a simulation/run. In contrast to the case of a single FEA analysis used in prior art, with 17 FEA analysis instances using the current invention (in the case of the Table in FIG. 1, shown in FIG. 5 as B, C) there are a multiplicity of options for distributing the FEA analysis instances. In the preferred embodiment, these alternatives comprise part of the linkage information.

More specifically, the preferred embodiment of the present invention requires the linkage information to specify (1) where the FEA analyses are to be done and (2) how the various FEA analyses will pass information to each other. Regarding (1), the multiple, concurrently running FEA analyses could be done in a single process on a single computer as illustrated by the sequence diagram of FIG. 5. While a natural configuration for smaller analysis, the use of multiple processes, optionally spread across multiple computers, can significantly increase the overall performance of a simulation/run. Regarding (2), the linkage information specifies whether the various linked FEA analysis instances should communicate directly with each other as illustrated in FIG. 5 (a peer-to-peer communication), or whether they should communicate indirectly through an intermediary "controller".

The sequence of FIGS. 6a through 6d illustrates some of the resulting simulation/run-time alternatives that can result from the specification of the linkage in the preferred embodiment. They illustrate some of the alternative simulation/run-time configurations that could be created using the proper linkage specification.

FIG. 6a illustrates the simplest deployment configuration for a simulation/run for the Table in FIG. 1. In this configuration of the preferred embodiment, the Controller, the Table analysis, and the 16 Low-level FEA analysis instances all coexist in the same process on a single computer. All of the memory required is available within the single process space. Both configuration alternatives are illustrated in FIG. 6a:

alternative 1, which illustrates peer-to-peer interaction between the Table level and the 16 low-level FEA analysis instances, and alternative 2, which illustrates a controller-managed scenario where all interaction between the FEA analysis instances is done through the controller. Notice in both alternatives that Low-level FEA instances #3 through #1.4 are listed with the "..." notation and are not specifically drawn.

FIG. 6b illustrates a slightly more complex deployment configuration—one which uses caching of the data used in the various FEA analysis instances, but still a single process on a single computer. Notice that the illustration depicts a cache for the High-Level, Table-level FEA analysis as well as a cache for the #1, #2, #15 and #16 Low-level FEA analysis instances. Obviously, without any loss of generality, configuration information could specify that all the FEA analysis instances or any subset could use a cache to reduce the total core memory required for the problem.

FIG. 6c extends the illustration of solving the Table problem of FIG. 1 to a configuration that uses multiple processes on a single computer. In the illustrated configuration, 4 processes are used. The first process contains the controller function, the High-level, Table FEA analysis, and 2 of the low-level analysis instances. Process 2 contains 6 of the other instances and processes 3 and 4 contain 4 each of the remaining low-level instances. This is simply an example configuration, illustrating that the various functions can be configured to be deployed in any configuration across any number of processes. In FIG. 6c there are no FEA instances that are caching their state information—all are maintaining it in core memory.

FIG. 6d illustrates another level of complexity in the deployment configuration for the solution of the Table example of FIG. 1. In this illustration, the same configuration of processes is used as in FIG. 6c, but they are deployed across multiple machines (2 in this illustration). Additionally, the use of caching is illustrated for all the FEA analysis instances. However, a more complex caching configuration is illustrated, wherein the High level and 10 of the 16 low-level FEA analysis instances are configured to use a dedicated cache, while 2 other caches are configured to each service multiple of the low-level FEA analysis instances. One cache is configured to support low-level analysis instances #3, #4 and #5 and the other to support #6, #7, #8.

In one example of the teachings and suggestions shown or presented in this disclosure, a method and/or computer-implemented system for coupling multiple, concurrently-running FEA analyses of an entity that has multiple levels of organization in a way that enables each analysis to inform and be informed by analyses of higher and/or lower levels of organization in the entity can comprise: (a) a "controller" function capable of at least: (i) initializing the overall FEA simulation problem, (ii) coordinating the overall movement through the sequence of the analysis, (iii) coordinating establishing multiple FEA analyses and initializing them using by loading the definitions of the various FEA models used to describe the various levels of organization in an entity and their relationship to each other, possibly including delegating the FEA analysis startup loading of some of the FEA models and their relationship to one or more of the running FEA analyses, and (iv) facilitating interaction between the concurrently running FEA analyses, possibly including a using translation/transformation function that modifies the state information from one FEA analysis so as to make it useful in informing other of the FEA analyses, and (b) two or more instances of a Finite Element Analysis (FEA) analysis function each capable of at least: (i) focusing on a specific aspect of the entity at a specific level of organization in the entity, (ii) loading the appropriate model(s) required for its analysis, (iii) the ability to send its state information regarding the current state of the entity at the level it is modeling to other instances of FEA analyses focusing on higher and/or lower levels of organization in the entity, possibly including a translation/transformation function that modifies the state information so as to make it useful in informing other the of the FEA analyses, (iv) the ability to be informed by FEA analyses occurring on higher and/or lower levels of organization in the entity by receiving state information from those models, and (v) the ability to output result data during and/or subsequent to the FEA analysis.

In one example, the method and/or computer-implemented system described above for coupling multiple, concurrently-running FEA analyses of an entity that has multiple levels of organization can comprise employing the "controller" to manage the flow of state information between FEA analysis instances, where the "controller" is capable of at least: (a) passing state information between the multiple FEA analyses, and (b) using a translation/transformation function that modifies the state information from one FEA analysis so as to make it useful in informing other of the FEA analyses.

In a different example, the method and/or computer-implemented system described above for coupling multiple, concurrently-running FEA analyses of an entity that has multiple levels of organization can comprise employing the various FEA analysis instances to directly manage the flow of state information between themselves and other FEA analyses, each FEA analysis capable of at least: (a) passing state information to other FEA analysis instances, (b) receiving state information from other FEA analysis instances and using it to inform its analysis, and (c) using a translation/transformation function that modifies the state information from one FEA analysis so as to either: (i) make incoming information from other FEA analysis instances applicable to its own analysis, or (ii) make its own state information applicable to other FEA analyses instances.

In one embodiment of the examples described above, the method and/or computer-implemented system for coupling multiple, concurrently-running FEA analyses of an entity that has multiple levels of organization can comprise employing a single process on a single computer wherein all the FEA analyses are contained within a single running process and the RAM memory physically available on the computer.

In a different embodiment, the method and/or computer-implemented system for coupling multiple, concurrently-running FEA analyses of an entity that has multiple levels of organization can comprise employing a single process on a single computer wherein all the FEA analyses are contained within a single running process whereas the memory used for some or all of the various FEA analyses is cached from the computer's physical RAM to disc during the analysis, using a caching algorithm.

In a another embodiment, the method and/or computer-implemented system for coupling multiple, concurrently-running FEA analyses of an entity that has multiple levels of organization can comprise employing multiple processes on a single computer wherein all the FEA analyses are contained within a single computer but in multiple running processes, and the memory required for the FEA analyses is kept in the RAM memory physically available on the computer.

In an alternate embodiment, the method and/or computer-implemented system for coupling multiple, concurrently-running FEA analyses of an entity that has multiple levels of organization can comprise employing multiple process on a single computer wherein all the FEA analyses are contained within a single computer but in multiple running process, whereas the memory used for some or all of the various FEA analyses is cached from the computer's physical RAM to disc during the analysis, using a caching algorithm.

In a yet another embodiment, the method and/or computer-implemented system for coupling multiple, concurrently-running FEA analyses of an entity that has multiple levels of organization can comprise employing multiple processes on multiple computers wherein all the FEA analyses are spread across multiple computers in multiple running processes, and the memory required for the FEA analyses is kept in the RAM memory physically available on the computers.

In a further embodiment, the method and/or computer-implemented system for coupling multiple, concurrently-running FEA analyses of an entity that has multiple levels of organization can comprise employing multiple processes on multiple computers wherein all the FEA analyses are spread across multiple computers in multiple running process, whereas the memory used for some or all of the various FEA analyses is cached from the computers' physical RAM to disc during the analysis, using a caching algorithm.

This description is merely exemplary in nature and, thus, variations that do not depart from the gist of the disclosure are intended to be within the scope of the invention. Such variations are not to be regarded as a departure from the spirit and scope of the invention. For example, to simplify the illustration and explanation, the description has used the analysis of the Table with 16 elements in the top of one leg represented by one of the two example microstructures pictured in FIG. 1. Without loss of generality, any or all of the Lego® pieces/elements in the Table could be connected to separate, concurrent FEA analysis instances. Further, without loss of generality, one or more Lego® pieces/elements in one or more of these Low-Level FEA analyses could also be connected to one or more FEA analysis instances operating at an even lower level. For example, consider the description of the hierarchical description of bulk muscle in FIG. 2. Nothing in the preferred embodiment of the present invention prevents creating a 5 level simulation/run with one or more elements in an FEA analysis at the level of the bulk muscle connected to an FEA analysis at the level of Muscle Fiber Groups, each of which contains one or more elements connected to an FEA analysis at the level of a Muscle Fiber, each of which contains one or more elements connected to an FEA analysis at the level of a Myofibril, each of which contains one or more elements connected to an FEA analysis at the level of a sarcomere. Further, while the illustrations have shown interaction between the FEA analysis instances at different levels, nothing prevents the present invention from using communication between FEA analysis at the same level, for example 2 of the Low-level FEA analysis instances from communicating state information back and forth during analysis.

What is claimed is:

1. A system for coupling multiple finite element analysis (FEA) analyses of an entity that has two or more levels of organization, the system comprising:
   an instance set of the FEA analyses simulating the entity, the instance set comprising:
      a first-level instance configured to use a first-level model of a first one of the two or more levels of organization; and
      one or more second-level instances configured to use one or more second-level models of a second one of the two or more levels of organization;
   a controller module configured to:
      generate at least one of the first-level instance or the one or more second-level instances of the instance set;
      communicate with the instance set to control a progression of the simulation; and
      output result data based on the simulation at least at an end of the progression of the simulation;
   one or more computers;
   wherein:
      the one or more second-level instances are configured to use information about the first-level instance to analyze at least a portion of the second one of the two or more levels of organization based on at least one of the one or more second-level models;
      the first-level instance is configured to use information about the one or more second-level instances to analyze at least a portion of the first one of the two or more levels of organization based on the first-level model;
      the information about the first-level instance and the information about the one or more second-level instances are updated through the progression of the simulation; and
      the instance set and the controller module are configured to be executed by at least one of the one or more computers.

2. The system of claim 1, wherein:
the controller module is configured to output the result data via at least one of:
   the first-level instance; or
   the one or more second-level instances.

3. The system of claim 1, wherein:
a first one of the one or more second-level instances is configured to use a first one of the one or more second-level models to model a first portion of the second one of the two or more levels of organization; and
a second one of the one or more second-level instances is configured to use a second one of the one or more second-level models to model a second portion of the second one of the two or more levels of organization.

4. The system of claim 1, wherein:
at least one of the information about the first-level instance or the information about the one or more second-level instances comprises at least one of:
   a stiffness parameter;
   a stress parameter;
   a strain parameter;
   a velocity parameter;
   a length parameter;
   a volume parameter;
   a displacement parameter;
   a heat parameter;
   an electrical parameter;
   a pressure parameter;
   a chemical parameter;
   a magnetic parameter;
   a thermal parameter;
   a force field parameter; or
   linkage information.

5. The system of claim 1, wherein:
the controller module generates the one or more second-level instances via the first-level instance;
the one or more second-level instances receive the information about the first-level instance via the first-level instance; and
the first-level instance receives the information about the one or more second-level instances via at least one of the one or more second-level instances.

6. The system of claim 1, wherein:
the information about the first-level instance and the information about the one or more second-level instances are routed throughout the instance set based on linkage information.

7. The system of claim 6, wherein:
the information about the first-level instance comprises a first instance state information;
the information about the one or more second-level instances comprises a second instance state information; and
the first-level instance is further configured to:
  forward the first instance state information to at least a first one of the one or more second-level instances;
  receive the second instance state information from at least one of the one or more second-level instances; and
  perform a first-level finite element analysis based on the second instance state information and the first-level model.

8. The system of claim 7, wherein:
the first-level instance is further configured to forward the first instance state information via the controller module; and
the first-level instance is configured to receive the second instance state information via the controller module.

9. The system of claim 7, wherein:
the controller module is configured to translate the second instance state information for the first-level instance based on the linkage information.

10. The system of claim 7, wherein:
the first-level instance is configured to use the linkage information to translate at least one of:
  the second instance state information after being received from the one or more second-level instances; or
  the first instance state information prior to forwarding the first instance state information to the one or more second-level instances.

11. The system of claim 6, wherein:
the information about the first-level instance comprises a first instance state information;
the information about the one or more second-level instances comprises a second instance state information; and
at least one of the one or more second-level instances is configured to:
  receive the first instance state information from the first-level instance;
  perform a second-level finite element analysis based on the first instance state information and at least one of the one or more second-level models; and
  forward the second instance state information to the first-level instance.

12. The system of claim 11, wherein:
the controller module is configured to translate the first instance state information for the at least one of the one or more second-level instances based on the linkage information.

13. The system of claim 11, wherein:
the at least one of the one or more second-level instances is configured to use the linkage information to translate at least one of:
  the first instance state information once received from the first-level instance; or
  the second instance state information prior to forwarding the second instance state information to the first-level instance.

14. The system of claim 1, wherein:
the controller module is further configured to:
  instruct the instance set to perform an iteration of the simulation;
  receive at least one state information from the instance set after the iteration; and
  evaluate the at least one state information to determine whether the simulation requires a second iteration.

15. The system of claim 14, wherein:
at least one of the first-level instance or the one or more second-level instances of the instance set is configured to output instance result data during the iteration of the simulation.

16. The system of claim 14, wherein:
the controller module is further configured to instruct at least one of the first-level instance or the one or more second-level instances to output instance result data during the iteration of the simulation.

17. The system of claim 1, further comprising:
one or more memories distributed across the one or more computers; and
two or more processes distributed across the one or more memories;
wherein:
  the controller module and the instance set are distributed between the two or more processes; and
  at least one process of the two or more processes is capable of communicating with at least another process of the two or more processes.

18. The system of claim 1, further comprising:
one or more caches distributed across the one or more computers;
wherein the controller module and the instance set are capable of storing data in the caches.

19. A computer-implemented method for coupling multiple finite element analysis (FEA) analyses of an entity that has two or more levels of organization, the method comprising:
  initializing one or more instances of the FEA analyses, the one or more instances comprising at least a first-level instance of the first level of organization and one or more second-level instances of the second level of organization;
  communicating with the one or more instances to control a progression of the finite element analysis;
  routing information about the first-level instance to the one or more second-level instances based on linkage information;
  accessing two or more second-level models based on the information about the first-level instance;
  analyzing the second level of organization with the one or more second-level instances based on the two or more second-level models and the information about the first-level instance to generate information about the one or more second-level instances;
  routing the information about the one or more second-level instances to the first-level instance based on linkage information;
  analyzing the first level of organization with the first-level instance based on a first-level model and the information about the one or more second-level instances to create result data of the finite element analysis; and
  outputting the result data of the finite element analysis to permit characterization of the entity.

20. The method of claim 19, wherein:
the one or more second-level instances use different ones of the two or more second-level models to model different portions of the second level of organization.

21. A system for coupling multiple finite element analysis (FEA) analyses of an entity that has two or more levels of organization, the system comprising:
 a controller module;
 a high-level module configured to use a high-level module state information;
 a first low-level module configured to use a first low-level module state information; and
 a second low-level module configured to use a second low-level module state information;
 one or more computers;
 a high-level model configured to describe at least part of the high level of organization of the entity; and
 one or more low-level models configured to describe at least part of the low level of organization of the entity;
 wherein:
  the controller module, the high-level module, and the first and second low-level modules are configured to be executed via at least one of the one or more computers;
  the controller module is configured to:
   initialize at least the high-level module; and
   communicate with at least the high level module to control a sequence of the analysis;
  the high-level module state information and the first and second low-level module state information comprise connectivity information for communication amongst the high-level module, the first low-level module, and the second low-level module;
  the high-level module is configured to:
   forward the high-level module state information to the first and second low-level modules based on the connectivity information;
   receive the first and second low-level module state information of the first and second low-level modules;
   perform a high-level finite element analysis based on the first and second low-level module state information and the high-level model; and
   update the high-level module state information based on the high-level finite element analysis;
  the first low-level module is configured to:
   receive the high-level module state information of the high-level module;
   perform a first low-level finite element analysis of a first part of the low level of organization of the entity based on the high-level module state information and a first one or the one or more low-level models;
   update the first low-level module state information based on the first low-level finite element analysis; and
   forward the first low-level module state information to the high-level module based on the connectivity information;
  the second low-level module is configured to:
   receive the high-level module state information of the high-level module;
   perform a second low-level finite element analysis of a second part of the low level of organization of the entity based on the high-level module state information and a second one of the one or more low-level models;
   update the second low-level module state information based on the second low-level finite element analysis; and
   forward the second low-level module state information to the high-level module based on the connectivity information;
 and
  the controller module is further configured to:
   translate the high-level module state information for use by the first and second low-level modules;
   translate the first and second low-level module state information for use by the high-level module;
   initialize an iteration of the sequence of the analysis with the high-level module and the first and second low-level modules;
   receive at least the high-level module state information after the iteration;
   evaluate the high-level module state information to determine whether the analysis requires a second iteration; and
   output results of the analysis at least at an end of the sequence of the analysis.

* * * * *